United States Patent [19]
Lee

[11] Patent Number: 5,349,556
[45] Date of Patent: Sep. 20, 1994

[54] ROW REDUNDANCY CIRCUIT SHARING A FUSE BOX

[75] Inventor: Kyu-Chan Lee, Ahnsan, Rep. of Korea

[73] Assignee: Samsung Electronics Co., Ltd., Kyungki-do, Rep. of Korea

[21] Appl. No.: 90,691

[22] Filed: Jul. 13, 1993

[30] Foreign Application Priority Data

Jul. 13, 1992 [KR] Rep. of Korea ............... 12436

[51] Int. Cl.$^5$ .............................................. G11C 7/00
[52] U.S. Cl. ........................... 365/200; 365/225.7; 371/10.3
[58] Field of Search ............... 365/200, 230.03, 225.7; 371/10.3, 10.1

[56] References Cited

U.S. PATENT DOCUMENTS

| | | | |
|---|---|---|---|
| 4,660,179 | 4/1987 | Aoyama | 365/200 |
| 4,727,516 | 2/1988 | Yoshida et al. | 365/200 |
| 5,255,234 | 10/1993 | Seok | 365/200 X |

Primary Examiner—Joseph A. Popek
Attorney, Agent, or Firm—Cushman, Darby & Cushman

[57] ABSTRACT

The present invention discloses a row redundancy circuit in which, when the number of word lines containing defective memory cells in a first normal memory cell array is greater than the number of redundant word lines in a first redundant memory cell array, an adjacent redundant row address decoder and associated adjacent redundant word lines are used to repair such excess number of defects. Therefore, there is no need to increase the number of redundant row address decoders and redundancy efficiency is greatly increased.

12 Claims, 8 Drawing Sheets

ROW REDUNDANCY CIRCUIT SHARING A FUSE BOX

BACKGROUND OF THE INVENTION

1. The Field of the Art

The present invention relates to a semiconductor memory device, and more particularly to a row redundancy circuit for repairing row defects generated in a given memory cell by the use of a redundant memory cell.

2. Background of the Related Art

As is well known in the art, a semiconductor memory device has a plurality of memory cells arranged in a matrix of columns and rows. As the capacity of a memory is increased, the semiconductor memory device contains more memory cells. In semiconductor memory devices, if defects are generated in any one memory cell, the semiconductor memory device cannot be used. In order to improve yields even if there is a defective memory cell, methods for replacing the defective normal memory cell with a redundant memory cell are well known.

One example of such a redundancy technique connects a fuse with each bit line or word line of the semiconductor memory device. If defects are generated in a normal memory cell, the fuse connected to the bit line or word line to which the normal memory cell is coupled is cut by a laser beam, for example.

However, as the integration density of semiconductor memory devices increases, it is wasteful of overall chip area to connect a fuse with each bit line and word line of the chip.

Therefore, another method for using redundant memory cells when there is defective normal memory cell provides a redundant row decoder programmed with an address corresponding to the normal row address containing the defective memory cell. This method is the generally preferred method.

Referring to FIG. 1, a conventional row redundancy circuit using redundant row address decoding method is shown. There are provided a first normal memory cell array 20L, a first redundant memory cell array 30L and a second normal memory cell array 20R, a second redundant memory cell array 30R disposed around an input/output (I/O) line 50. Each memory cell group including the redundant and normal memory cell arrays has first and second sense amplifiers 40L, 40R and first and second bit line equalizing circuits 10L, 10R. Moreover, each memory cell group contains first and second sense amplifier control circuits 60L', 60R', first and second redundant word line drivers 70L', 70R', first and second redundant row address decoders or fuse boxes 80L', 80R', and first and second normal word line drivers 90L', 90R'.

FIG. 1 shows a two memory arrays and a plurality of such memory arrays are included in one chip.

In the decoding method of FIG. 1, the redundant memory cell arrays 30L and 30R are respectively selected when a redundant row address is decoded by the redundant row address decoders 80L'and 80R'. The outputs of the redundant memory cell arrays 30L and 30R are enabled by the redundant word line drivers 70L' and 70R'. That is, if defects are generated in the first normal memory cell array 20L, the first redundant memory cell array 30L is used, and if the defects are generated in the second normal memory cell array 20R, the second redundant memory cell array 30R is used.

For example, if there are defects in the word line of the first normal memory cell array 20L, an address of the defective word line is programmed in the first fuse box 80L' and the redundant word line corresponding to the defective normal word line is enabled in the redundant memory cell array 30L through the redundant word line driver 70L'. Further, the first sense amplifier 40L is enabled through the first sense amplifier control signal 60L' by the output signal REDL' from the first redundant row address decoder 80L', and as a result, the redundant word line is selected.

FIG. 2 shows a detailed circuit diagram of the first redundant row address decoder 80L' for programming the address in which the defects are generated. As shown, one redundant row address decoder has a plurality of fuses for receiving row addresses. After redundancy programming and during normal operation, a block selection signal $\phi$BLKL is applied to node N1. If the defective address is input, node N1 remains at a logic "high" level, thereby generating a redundant word line signal RWL.

In the circuit constructed in the above described manner, the normal memory cell array 20L or 20R have a large number of memory cells. In order to raise the probability of repairing all defective normal memory cells, at least one more redundant row address decoder is needed. As the number of redundant row address decoders increase, so does the need increase for additional word lines and associated redundant memory cells in the redundant memory cell arrays. Thus, the number of repairable word lines is limited by the number of corresponding redundant word lines within the redundant memory cell array. However, if a defective word line does not exist in the first normal memory cell array 20L, but the number of defective word lines generated in the second normal memory cell array 20R is greater than the number of redundant word lines in the second redundant memory cell array 30R, the resulting semiconductor memory device will be inoperable.

SUMMARY OF THE INVENTION

It is therefore an object of the present invention to provide a row redundancy circuit capable of high integration efficiency.

It is another object of the present invention to provide a row redundancy circuit that performs an effective redundancy operation.

It is a further object of the present invention to provide a row redundancy circuit wherein adjacent memory array blocks share a redundant row address decoder.

It is a still further object of the present invention to provide a row redundancy circuit wherein one redundant row address decoder controls sense amplifiers of adjacent memory arrays simultaneously.

The present invention accomplishes the above recited objects with a row redundancy circuit in which, when the number of word lines containing defective memory cells in a first normal memory cell array is greater than the number of redundant word lines in a first redundant memory cell array, an adjacent redundant row address decoder and associated adjacent redundant word lines are used to repair such excess number of defects.

Therefore, there is no need to increase the number of redundant row address decoders and redundancy efficiency is greatly increased.

BRIEF DESCRIPTION OF DRAWINGS

The advantages and features of the present invention will be more apparent from the detailed description hereunder, with reference to the attached drawings, in which.

DETAILED DESCRIPTION OF THE PREFERRED EMBODIMENT

Figure 1:
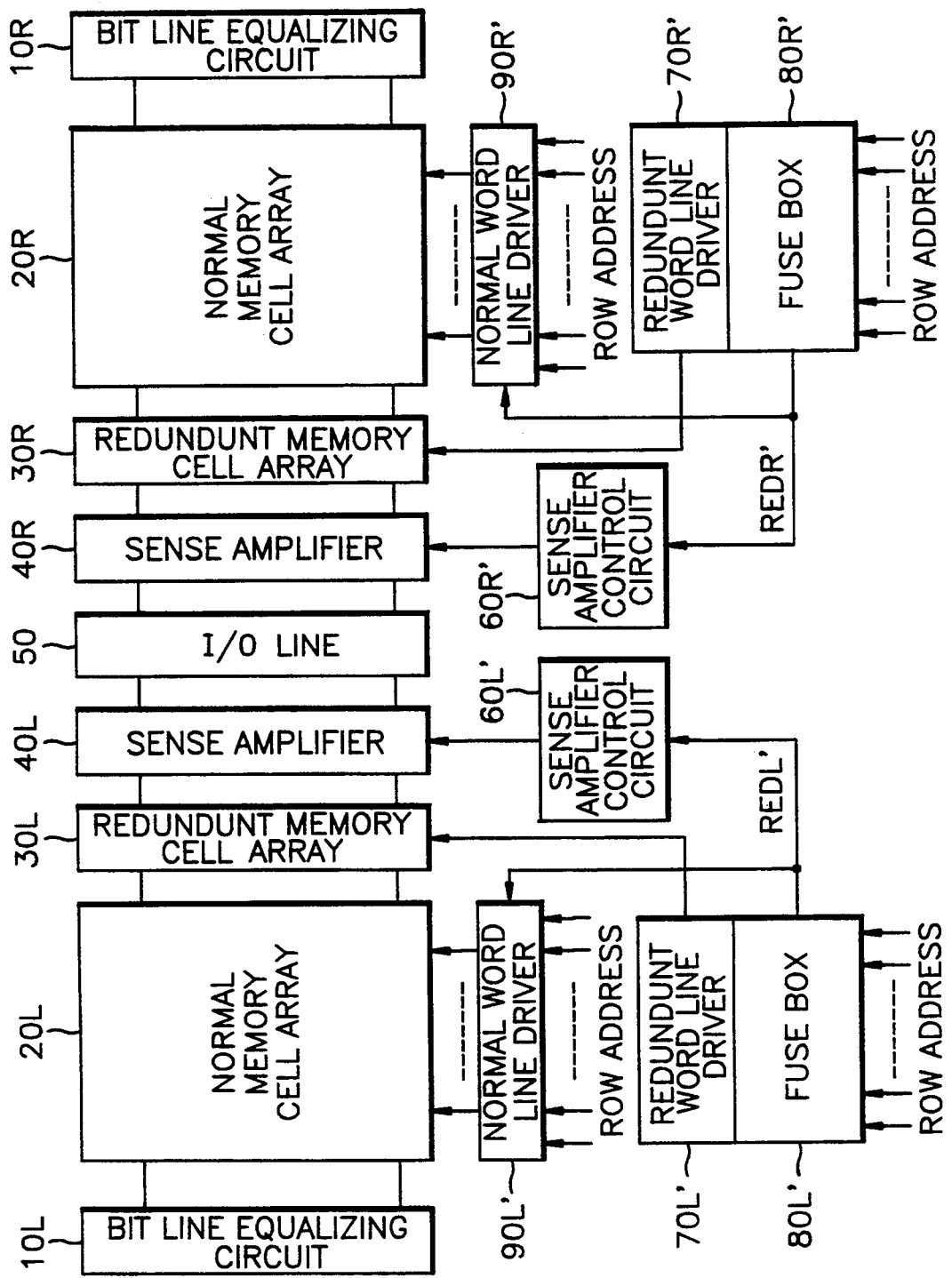
FIG. 1 is a block diagram of a conventional row redundancy circuit.
Figure 2:
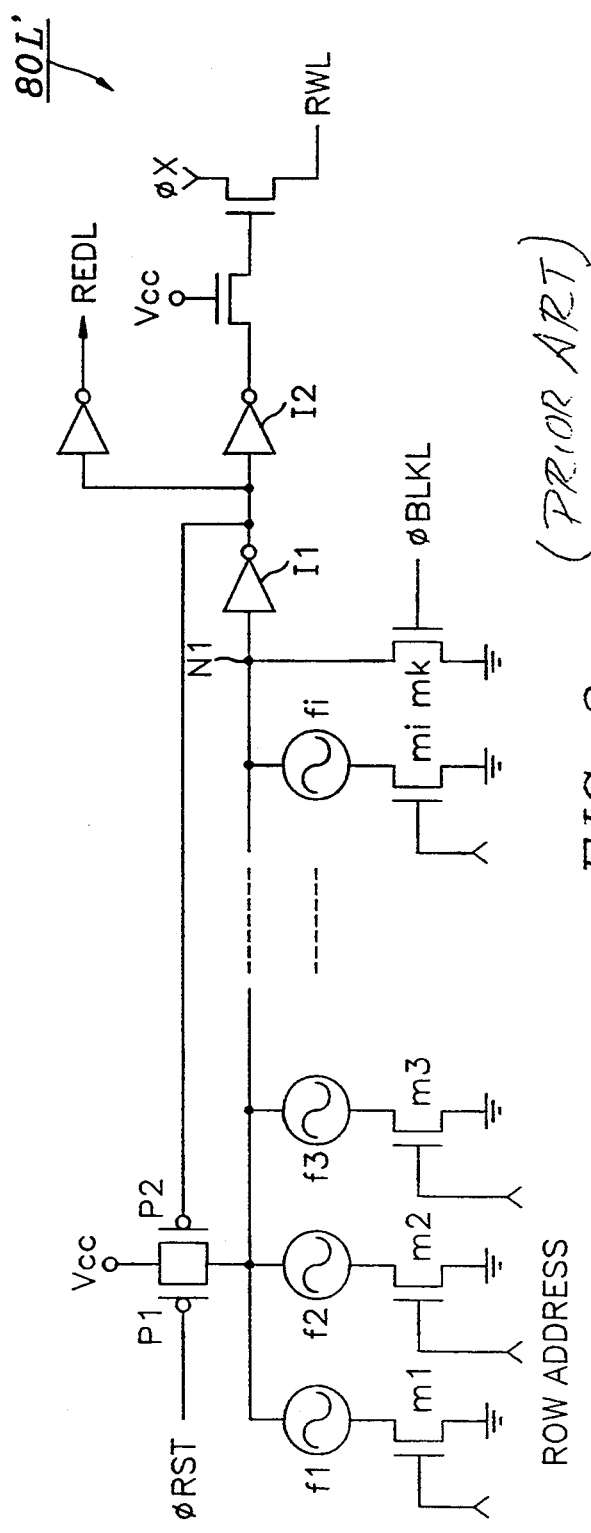
FIG. 2 is a more detailed circuit diagram of a redundant row address decoder of FIG. 1.
Figure 3:
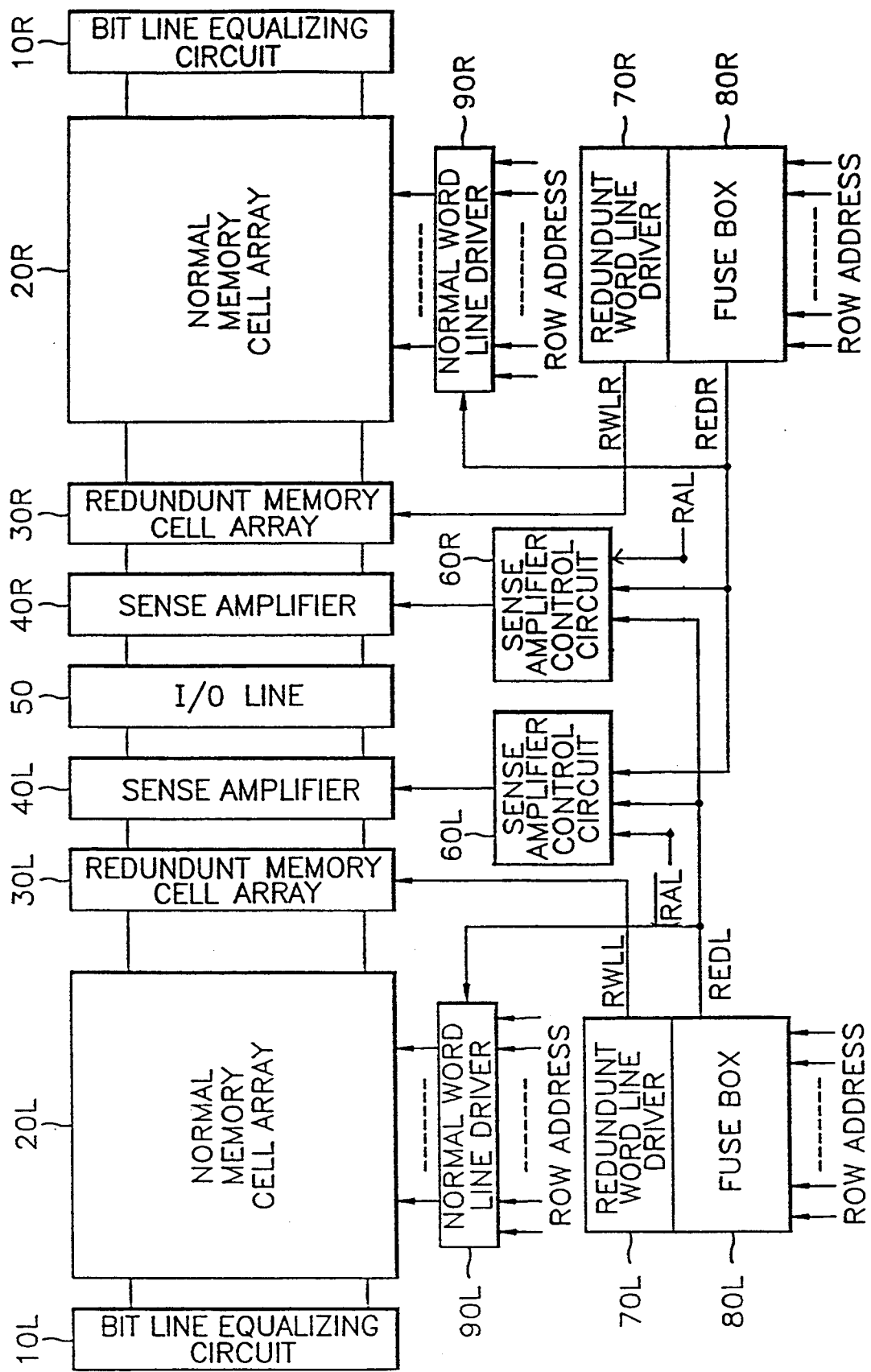
FIG. 3 is a block diagram of a row redundancy circuit according to the present invention.

The block diagram of FIG. 3 has the same overall configuration as that of FIG. 1, except that redundant row address decoders 80L and 80R are simultaneously connected to sense amplifier control circuits 60L and 60R. However, the detailed circuits and operations thereof are considerably different as will be explained hereinafter. In the explanation of the drawings, the same reference numerals and symbols are used to designate similar elements.

Referring to FIG. 3, first and second sense amplifier control circuits 60L and 60R are respectively connected to first and second sense amplifiers 40L and 40R. A first redundant row address decoder 80L normally receives a row address and the selection signal. If the input row address corresponds to the address programmed into redundant row address decoder 80L, output signal REDL is generated and is connected to the first and second sense amplifier control circuits 60L and 60R. A second redundant row address decoder 80R similarly normally receives the row address and the selection signal associated with the second normal memory cell array 20R. If the input row address corresponds to the address programmed into redundant row address decoder 80R, output signal REDR is connected to the first and second sense amplifier control circuits 60L and 60R. First and second redundant word line drivers 70L and 70R enable the first and second redundant memory cell arrays 30L and 30R, respectively.

If the number of word lines containing defective memory cells in the first normal memory cell array 20L is less than or equal to the number of redundant word lines in the first redundant memory cell array 30L, the row redundancy circuit of FIG. 3 performs substantially the same operation as that of FIG. 1.

However, when the number of word lines containing defective memory cells in the first normal memory cell array 20L is greater than the number of redundant word lines in the first redundant memory cell array 30L, if the address signal corresponding to the defective word line of the first normal memory cell array 20L is programmed into the first redundant row address decoder 80L, the signal REDL is enabled as a logic "low" level and the signal REDR is disabled as logic "high" level during operation when this address is decoded. Accordingly, the first redundant row address decoder 80L of FIG. 3 disables the second sense amplifier control circuit 60R, and enables the first sense amplifier control circuit 60L. If the address signal corresponding to another word line containing defective memory cells of the first normal memory cell array 20L is programmed into the second redundant row address decoder 80R, the signal REDR is enabled as logic "low" level and the signal REDL is disabled as logic "high" level. Accordingly, the second redundant row address decoder 80R disables the first sense amplifier control circuit 60L, and enables the second sense amplifier control circuit 60L. Thus, the defects in the first normal memory cell array 20L are repaired using the first redundant memory cell array 30L the second redundant memory cell array 30R the second redundant memory cell array 30R.

When there are no word lines containing defective memory cells in the first normal memory cell array 20L, if the number of word lines containing defective memory cells of the second normal memory cell array 20R is greater than the number of redundant word lines in the second redundant memory cell array 30R, the second redundant row address decoder 80R controls the second sense amplifier control circuit 60R to enable the second sense amplifier 40R, and disables the first sense amplifier control circuit 60L. The first redundant row address decoder 80L is then programmed with the address of the second word line containing defective memory cells disposed in the second normal memory cell array 20R. When this address is input, signal REDL enables first sense amplifier control circuit 60L and disables second sense amplifier control circuit 60R, thereby repairing the defective word lines of the second normal memory cell array 20R with the first redundant memory cell array 30L and the second redundant memory cell array 30R.

Figure 4:
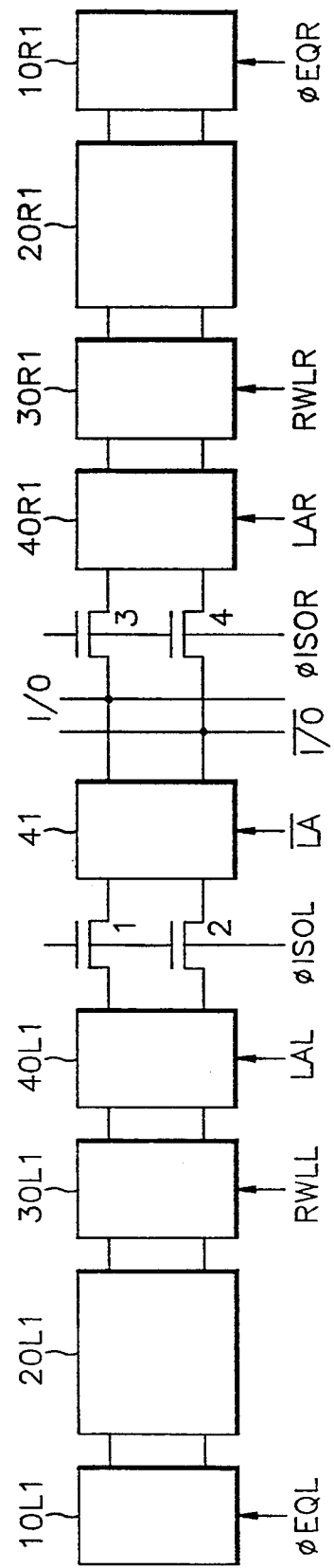
FIG. 4 shows a column structure of a memory array of FIG. 3.

For a more detailed description, FIG. 4 shows one column of the memory array of FIG. 3 and each control signal. The first and second sense amplifiers 40L and 40R of FIG. 3, as is well known in the art, each consist of first and second PMOS sense amplifiers 40L1 and 40R1 each sharing an NMOS sense amplifier 41. In order to separate the first and second PMOS sense amplifiers 40L1 and 40R1, there are provided isolation gates 1 and 2; 3 and 4 controlled by separate control signals $\phi$ISOL and $\phi$ISOR, respectively. The configuration of each block in FIG. 4 is well known in the art.

Each control signal of FIG. 4 is generated from the circuits of FIGS. 5A, 5B, 6A, 6B, 6C, 7A and 7B.

Figure 5A:
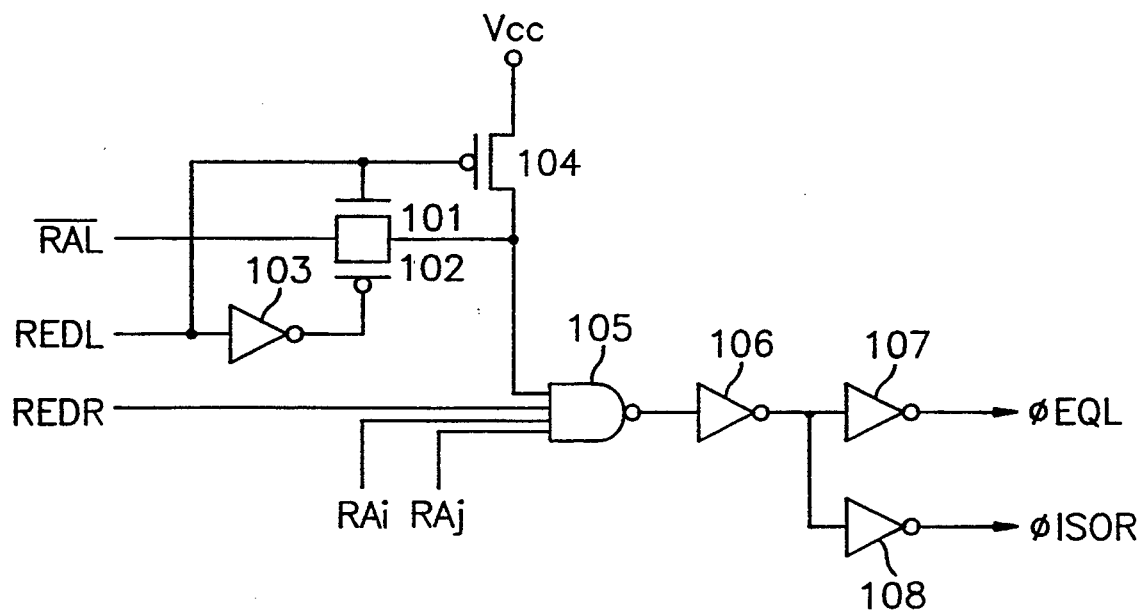
FIGS. 5A and 5B are circuit diagrams for generating bit line equalizing signals of FIG. 3.
Figure 5B:
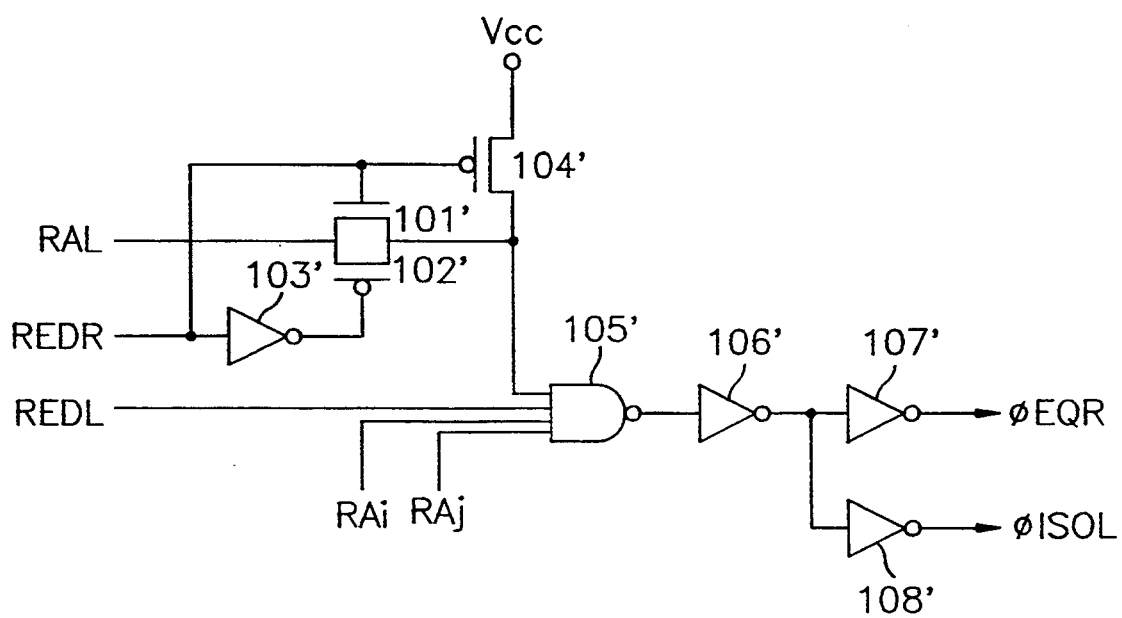

Bit line equalizing control signals $\phi$EQL and $\phi$EQR of first and second bit line equalizing circuits 10L1 and 10R1, and the isolation control signals $\phi$ISOL and $\phi$ISOR are generated from the circuits of FIGS. 5A and 5B. A signal $\overline{\text{RAL}}$ of FIG. 5A is for selecting a first cell array 20L1 and a first redundant memory cell array 30L1, and a signal RAL of FIG. 5B is for selecting a second cell array 20R1 and a second redundant memory cell array 30R1. Signals RAi and Raj are for selecting the illustrated memory arrays of FIG. 3, assuming that there are a greater number of such arrays on the chip. If the first redundant memory cell array 30L1 is selected, the signals $\overline{\text{RAL}}$, REDR, RAi and RAj of FIG. 5A are set to logic "high" level and the signal REDL is set to a logic "low" level, the output of the NAND gate 105 is set to logic "low" level. Therefore, the bit line equalizing control signal $\phi$EQL and the separate control signal $\phi$ISOR are set to logic "low" level, and the output of the first redundant memory cell array 30L1 of FIG. 4 is enabled.

On the other hand, if the second redundant memory cell array 30R1 is selected, the signals RAL, REDL, RAi and RAj of FIG. 5B are set to logic "high" level and the signal REDR is set to a logic "low" level, the output of the NAND gate 105' is set to logic "low" level. Hence, the bit equalizing signal $\phi$EQR and the separate control signal $\phi$ISOL are set to logic "low" level and the output of the second redundant cell array 30R1 of FIG. 4 is enabled.

Figure 6A:
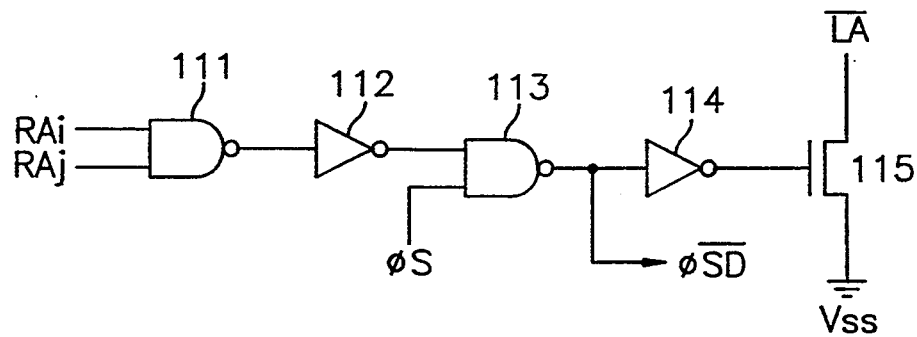
FIGS. 6A, 6B and 6C are circuit diagrams for generating sense amplifier control signals of FIG. 3.
Figure 6B:
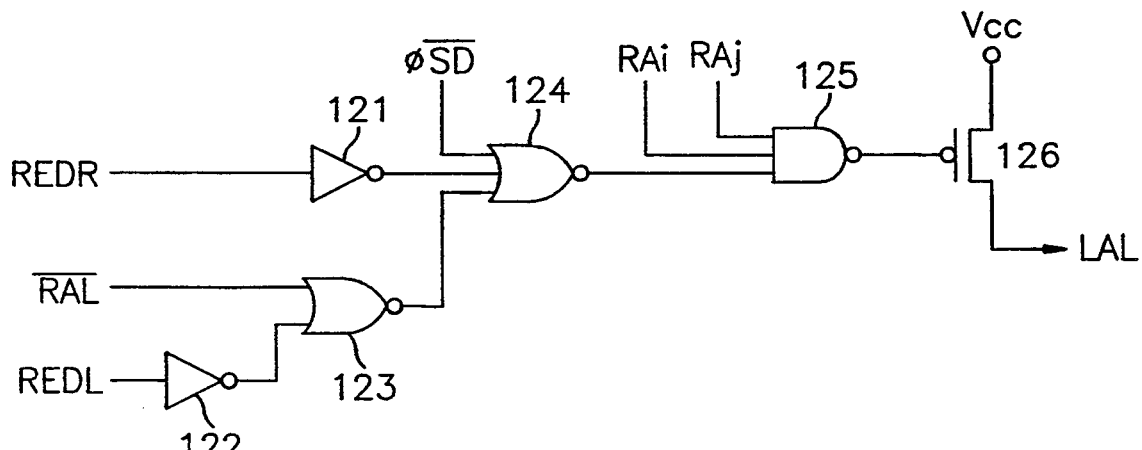
Figure 6C:
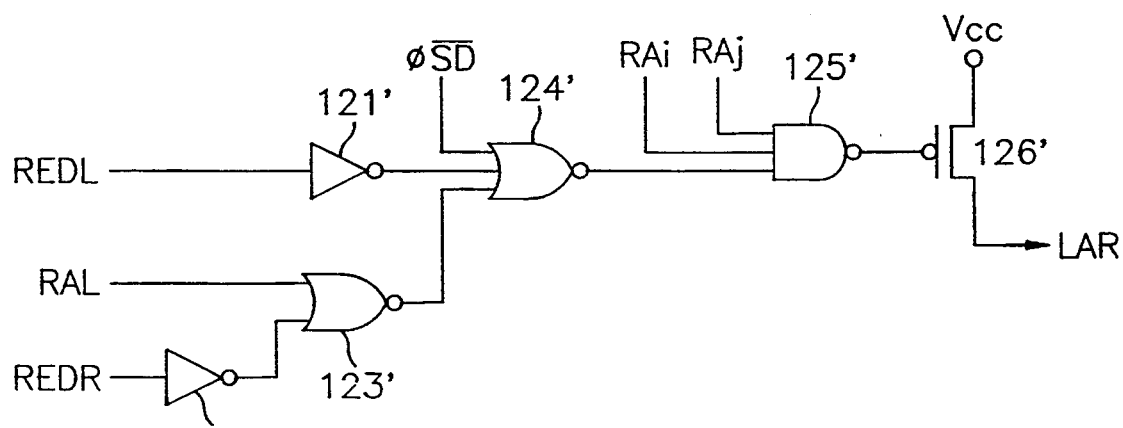

Sense amplifier control signals $\overline{LA}$, LAL and LAR of the sense amplifiers 41, 40L1 and 40R1 of FIG. 4 are generated from the circuits of FIGS. 6A, 6B and 6C. FIG. 6A shows the circuit for generating the signal $\overline{LA}$ controlling the NMOS sense amplifier 41 of FIG. 4. A timing signal $\phi$S is enabled to logic "high" level during a data sensing operation. If the first or second cell array is selected, the signals RAi, RAj and $\phi$S are all set to logic "high" level. Hence, an NMOS transistor 115 is turned on and the signal $\overline{LA}$ of logic "low" level is generated. The signal LA of the logic "low" level enables the NMOS sense amplifier 41 of FIG. 4.

FIG. 6B shows the circuit for generating the signal LAL controlling the first PMOS sense amplifier 40L1. Timing signal $\phi$S is delayed for a predetermined time to generate a signal $\phi$SD shown in FIG. 6A. In FIG. 4, when the first PMOS sense amplifier 40L1 is selected, the signal LAL must be set to logic "high" level. Therefore, if the first PMOS sense amplifier 40L1 is selected, the signals RAi, RAj, REDR and $\overline{RAL}$ are set to logic "high" level and the signal $\phi$SD is set to logic "low" level during normal operation. At this time, since the signal RAL is set to a logic "high" level, the signal $\overline{REDL}$ is ignored in the NOR gate 123. As a result, the signal LAL of logic "high" level is generated to enable the PMOS sense amplifier 40L1 of FIG. 4.

FIG. 6C shows the circuit for generating the signal LAR controlling the second PMOS sense amplifier 40R1. When the second PMOS sense amplifier 40R1 is selected, the signal LAR must be set to logic "high" level. Therefore, if the second PMOS sense amplifier 40R1 is selected, the signals RAi, RAj, REDL and RAL are set to logic "high" level and the signal $\phi$SD of logic "low" level during normal operation. At this time, since the signal RAL is set to a logic "high" level, the signal $\overline{REDL}$ is ignored in the NOR gate 123. As a result, the signal LAR of logic "high" level is generated to enable the PMOS sense amplifier 40R1 of FIG. 4 is enabled.

Figure 7A:
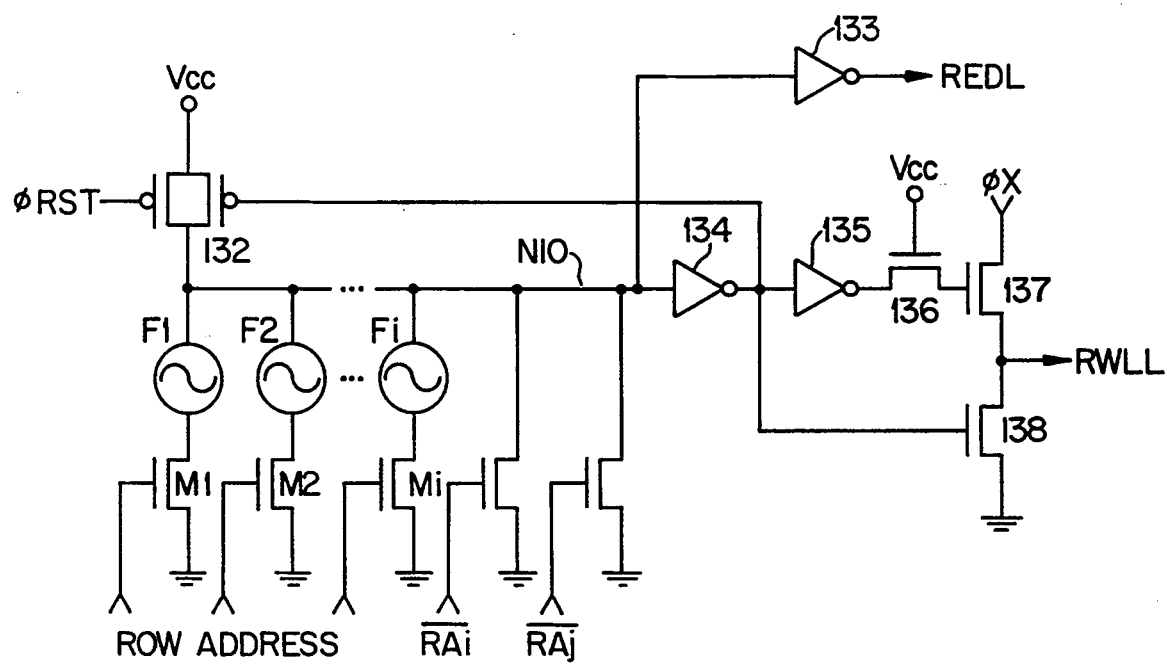
FIGS. 7A and 7B are circuit diagrams showing examples of a redundant row address decoder of FIG. 3.
Figure 7B:
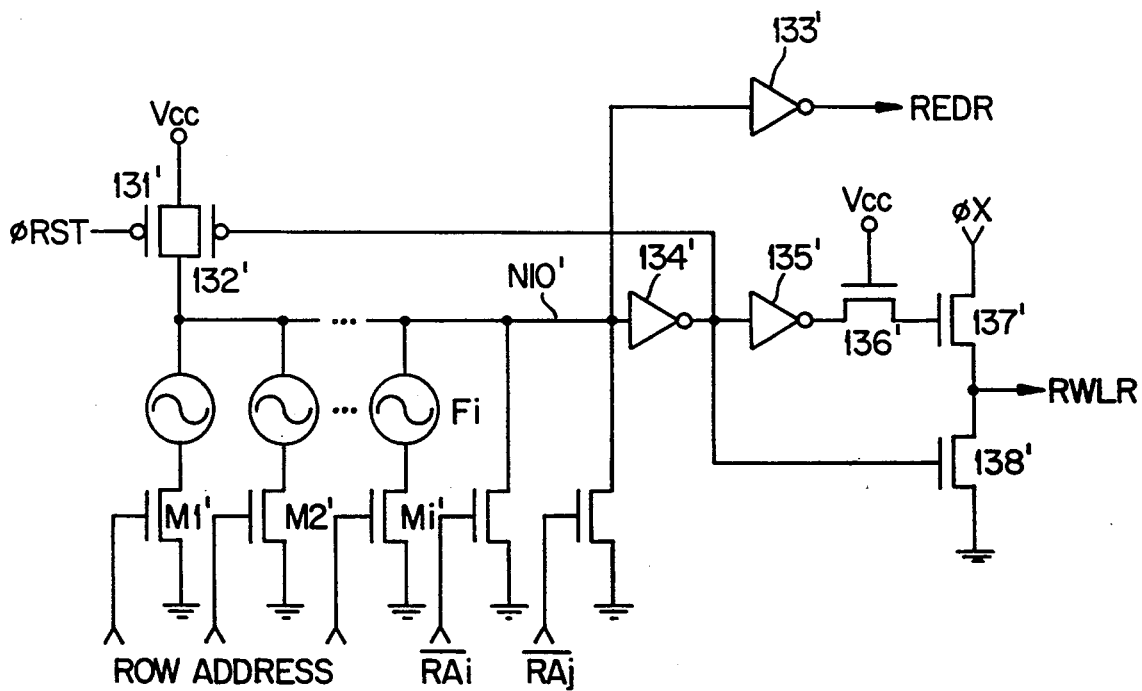

The redundant enable signals REDL and REDR for controlling the first and second sense amplifier control circuits 60L and 60R of FIG. 3 during a redundancy operation are generated from the redundant row address decoder circuits shown in FIGS. 7A and 7B. Referring to FIGS. 7A and 7B, NMOS transistors 137, 138 and 137', 138' are the redundant word line driver circuit and enable redundant word lines RWLL and RWLR, respectively. It should be noted that if a defective address is applied, the signals REDL and REDR are set to logic "low" level due to the electrical pathways programmed into the fuses to correspond to the defective address.

The redundancy operation of FIG. 3, in accordance with the circuits of FIGS. 5A, 5B, 6A, 6B, 6C, 7A and 7B, will now be described with reference to the timing diagrams of FIGS. 8A and 8B.

Assuming that one redundant word line exists in the first and second redundant memory cell arrays 30L and 30R, respectively and one word line containing defective memory cells exists in the first normal memory cell array 20L, since the redundant word line included in the first redundant memory cell array 3OL is sufficiently capable of repairing the word line containing defective memory cells, substantially the same redundancy operation with that of FIG. 1 is performed. If the number of redundant word lines contained in the first redundant memory cell array 3OL is one ("1") and the number of word lines containing defective memory cells generated in the first normal memory cell array 20L is two ("2"), it is impossible to repair the word lines containing defective memory cells using only the redundant word line in the first redundant memory cell array 30L.

Figure 8A:
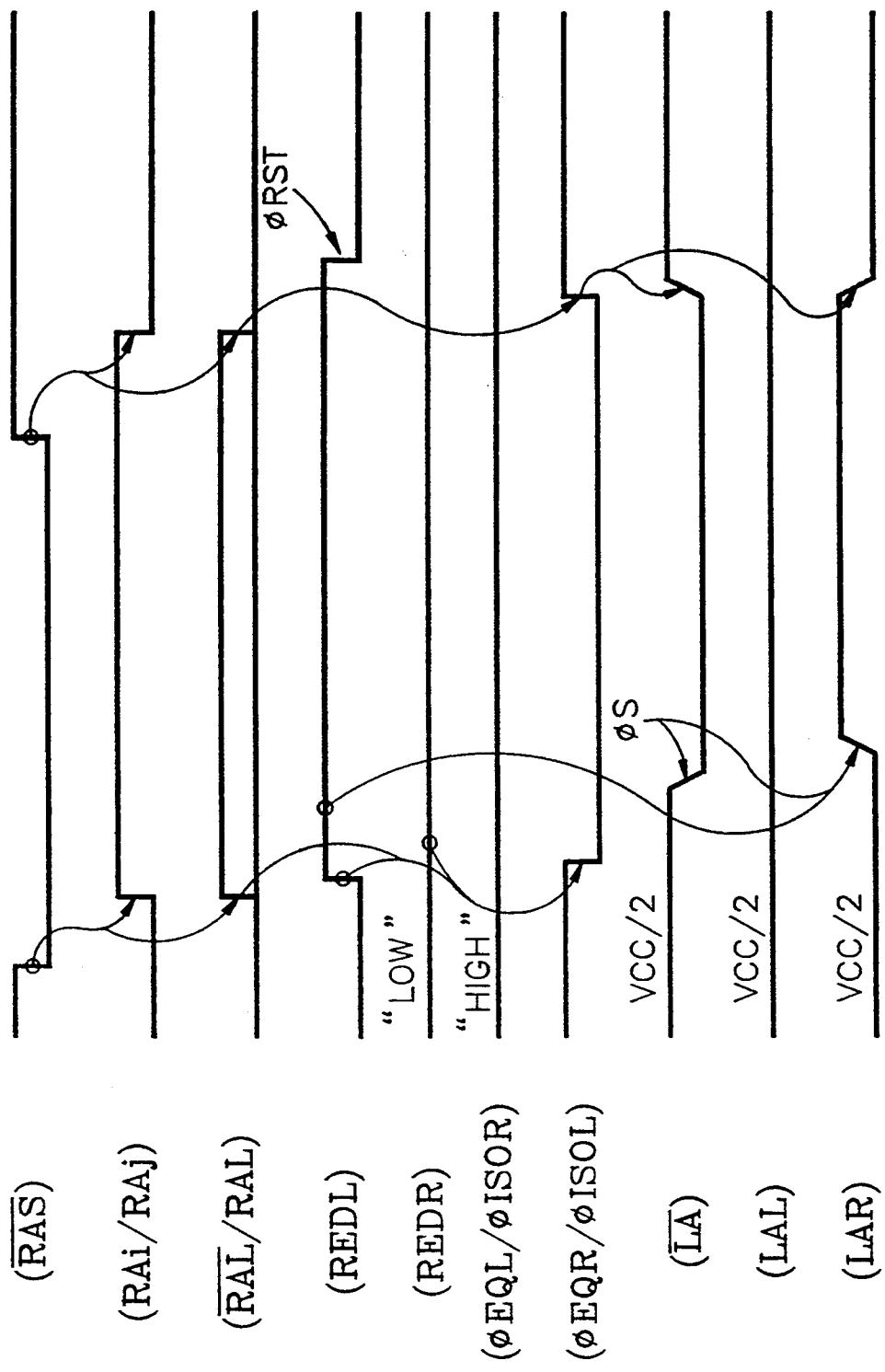
FIGS. 8A and 8B are timing diagram according to the present invention.
Figure 8B:
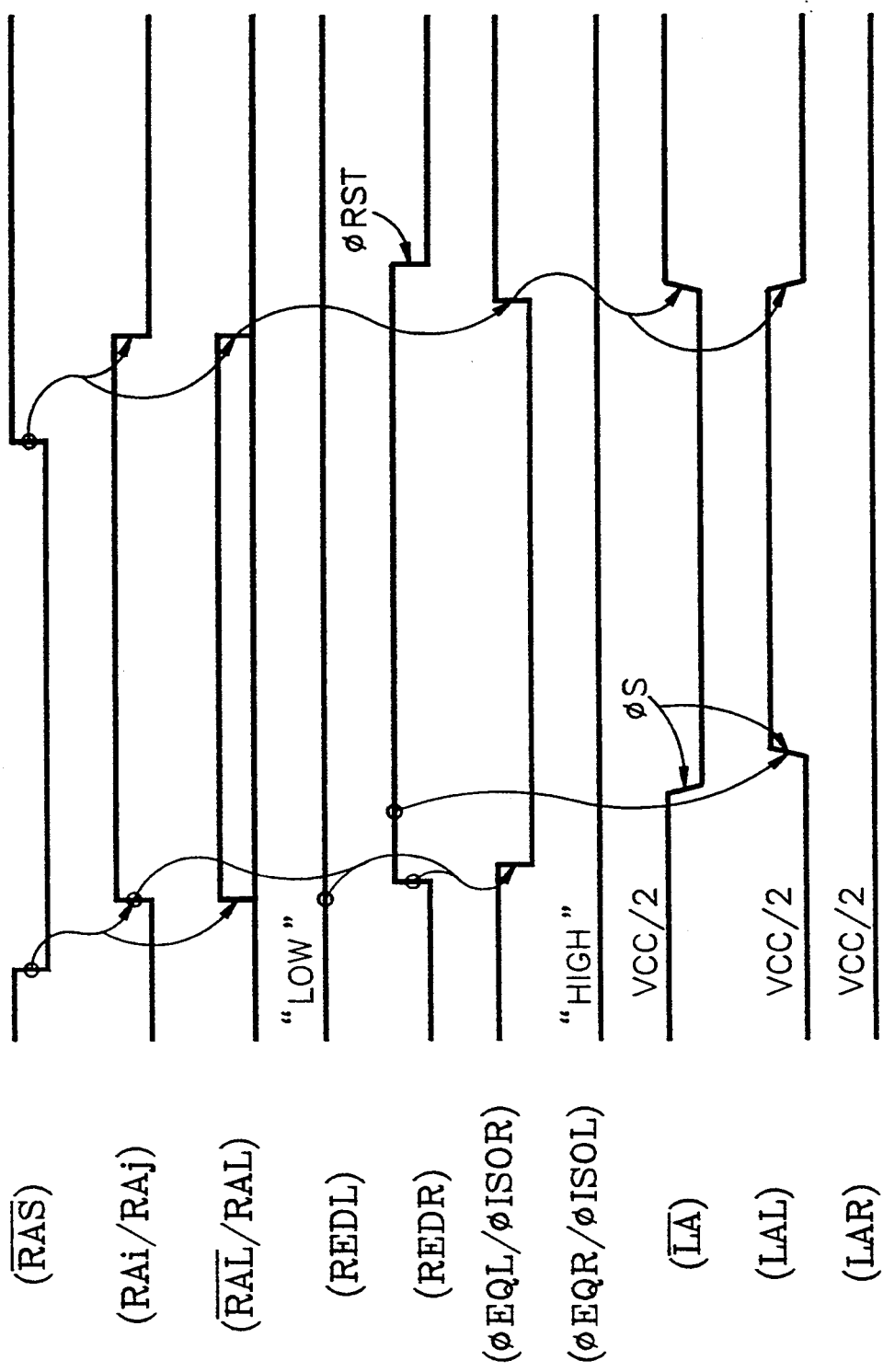

However, when the defective address signal is applied to the redundant row address decoder of FIG. 7A to repair one word line containing defective memory cells of two such word lines, a node N10 maintains logic "high" level and the signal REDL is set to logic "low" level as shown in FIG. 8B. An then, the redundant word line RWLL is enabled as logic "high" level. Further, in FIG. 6B, since the three input signals of the NOR gate 124 are set to logic "low" levels and the three input signals of the NAND gate 125 are set to logic "high" levels, the signal LAL is set to logic "low" level. In FIG. 6C, since the signal REDL is set to as logic "low" level, the NOR gate 124' outputs the signal of logic "low" level. As a result, the signal LAR is set to a precharge state of $\frac{1}{2}$ Vcc. Accordingly, the first PMOS sense amplifier 40L1 is enabled to replace the one word line having defective memory cells.

On the other hand, when the defective address signal is applied to the redundant row address decoder of FIG. 7B to repair the other word line containing defective memory cells, a nod N10' maintains logic "high" level and the signal REDR is set to logic "low" level as shown in FIG. 8A. And then, the redundant word line RWLR is enables as logic "high" level. Further, in FIG. 6C, since the three input signals of the NOR gate 124' are set to logic "low" levels and the three input signals of the NAND gate 124' are set to logic "high" levels, the signal LAR is set to a logic "high" level. In FIG. 6B, since the signal REDR is set to as logic "low" level, the NOR gate 124 outputs the signal of logic "low" level. As a result, the signal LAL is set to a precharge state of $\frac{1}{2}$ Vcc. Accordingly, the second PMOS sense amplifier 40R1 is enabled so as to replace the other word line containing defective memory cells.

When the second normal memory cell contains more word lines having memory cell defects than associated redundant word lines and associated redundant memory cells, operation of the first and second redundant memory cell arrays is similar to that described above. FIGS. 8A and 8B each respectively illustrate the timing associated with the first redundant memory cell array 30L1 and the second redundant memory cell array 30R1. Thus, according to the present invention, even if the number of word lines containing defective memory cells in the normal memory cell array is greater than the number of redundant word lines included in the redundant memory cell array, there is no necessity for increasing the number of redundant row address decoders connected only to that particular normal memory array.

As described above, in the row redundancy circuit embodying the present invention, since one redundant row address decoder controls each sense amplifier of adjacent memory arrays, there is no need to increase the number of redundant row address decoder in order to increase redundancy efficiency. While preferred embodiments of the present invention have been particularly shown and described, it will be understood by those skilled in the art that foregoing and other changes in form and details may be made without departing from the spirit and scope of the present invention.

What is claimed is:

1. A row redundancy circuit in a semiconductor memory device having a plurality of first normal memory cell arrays and a plurality of second normal memory cell arrays, each first normal memory cell array having a plurality of rows and further including a first redundant memory cell array and a first sense amplifier array, and each second normal memory cell array having a plurality of rows and further including a second redundant memory cell array and a second sense amplifier array, said second normal memory cell array being substantially adjacent to said first normal memory cell array, said row redundancy circuit comprising:
   a first sense amplifier control circuit connected to said first sense amplifier array that generates a first sense amplifier array control signal that is input to said first sense amplifier array; and
   a second sense amplifier control circuit connected to said second sense amplifier array that generates a second sense amplifier array control signal that is input to said second sense amplifier array;
   a first redundant row address decoder programmed to decode a first row address and a first array select signal associated with a first one of said rows located within one of said first normal memory cell arrays and said substantially adjacent second normal memory cell array, said first redundant row address decoder outputting a first redundant row address decode signal when said first row address is decoded to both said first and second sense amplifier control circuits; and
   a second redundant row address decoder programmed to decode a second row address and a second array select signal associated with a second one of said rows located within said one of said first normal memory cell arrays and said substantially adjacent second normal memory cell array, said second redundant row address decoder outputting a second redundant row address decode signal when said second row address is decoded to both said first and second sense amplifier control circuits.

2. A row redundancy circuit according to claim 1, wherein said first and second row addresses are both associated with said first normal memory cell array.

3. A row redundancy circuit according to claim 2, wherein said first sense amplifier control circuit generates said first sense amplifier array control signal in response to both said first redundant row address decode signal and said second redundant row address decode signal.

4. A row redundancy circuit according to claim 1, wherein said first and second row addresses are both associated with said second normal memory cell array.

5. A row redundancy circuit according to claim 4, wherein said second sense amplifier control circuit generates said second sense amplifier array control signal in response to both said first redundant row address decode signal and said second redundant row address decode signal.

6. A row redundancy circuit according to claim 1, wherein said first sense amplifier control circuit further inputs a first array select signal and said second sense amplifier control circuit further inputs a second array select signal so that only one of said first sense amplifier array control signal and said second sense amplifier array control signal are generated at the same time.

7. A row redundancy circuit in a semiconductor memory device having a plurality of first normal memory cell arrays and a plurality of second normal memory cell arrays, each first normal memory cell array having a plurality of rows and further including a first redundant memory cell array and a first sense amplifier array, and each second normal memory cell array having a plurality of rows and further including a second redundant memory cell array and a second sense amplifier array, said second normal memory cell array being substantially adjacent to said first normal memory cell array, said circuit comprising:
   a first sense amplifier control circuit connected to said first sense amplifier array that generates a first sense amplifier array control signal that is input to said first sense amplifier array; and
   a second sense amplifier control circuit connected to said second sense amplifier array that generates a second sense amplifier array control signal that is input to said second sense amplifier array;
   a first redundant row address decoder programmed to decode a first row address and a first array select signal associated with a first one of said rows located within one of said first normal memory cell arrays and said substantially adjacent second normal memory cell array, said first redundant row address decoder outputting a first redundant row address decode signal when said first row address is decoded to both said first and second sense amplifier control circuits;
   a second redundant row address decoder programmed to decode a second row address and a second array select signal associated with a second one of said rows located within said one of said first normal memory cell arrays and said substantially adjacent second normal memory cell array, said second redundant row address decoder outputting a second redundant row address decode signal when said second row address is decoded to both said first and second sense amplifier control circuits;
   a first redundant word line driver for enabling said first redundant memory cell array in response to said first redundant row address decode signal; and
   a second redundant word line driver for enabling said second redundant memory cell array in response to said second redundant row address decode signal.

8. A row redundancy circuit according to claim 7, wherein said first and second row addresses are both associated with said first normal memory cell array.

9. A row redundancy circuit according to claim 8, wherein said first sense amplifier control circuit generates said first sense amplifier array control signal in response to both said first redundant row address decode signal and said second redundant row address decode signal.

10. A row redundancy circuit according to claim 7, wherein said first and second row addresses are both associated with said second normal memory cell array.

11. A row redundancy circuit according to claim 10, wherein said second sense amplifier control circuit generates said second sense amplifier array control signal in response to both said first redundant row address decode signal and said second redundant row address decode signal.

12. A row redundancy circuit according to claim 7, wherein said first sense amplifier control circuit further inputs a first array select signal and said second sense amplifier control circuit further inputs a second array select signal so that only one of said first sense amplifier array control signal and said second sense amplifier array control signal are generated at the same time.

* * * * *